United States Patent [19]

Gibbons

[11] Patent Number: 4,544,418
[45] Date of Patent: Oct. 1, 1985

[54] PROCESS FOR HIGH TEMPERATURE SURFACE REACTIONS IN SEMICONDUCTOR MATERIAL

[76] Inventor: James F. Gibbons, 320 Tennyson Ave., Palo Alto, Calif. 94301

[21] Appl. No.: 600,486

[22] Filed: Apr. 16, 1984

[51] Int. Cl.$^4$ .................. H01L 21/31; H01L 21/469
[52] U.S. Cl. ......................... 148/1.5; 29/576 B; 29/576 T; 148/175; 148/187; 357/91; 427/53.1
[58] Field of Search ............... 148/1.5, 175, 187; 29/576 B, 576 T; 427/53.1; 357/91

[56] References Cited

U.S. PATENT DOCUMENTS

| | | | |
|---|---|---|---|
| 4,069,096 | 1/1978 | Reinberg | 156/643 |
| 4,159,917 | 7/1979 | Gluck | 148/1.5 |
| 4,214,919 | 7/1980 | Young | 148/1.5 |
| 4,246,296 | 1/1981 | Chang | 427/38 |
| 4,277,320 | 7/1981 | Beguwala et al. | 148/1.5 |
| 4,383,885 | 5/1983 | Maydan et al. | 156/646 |
| 4,410,401 | 10/1983 | Anselrode | 427/53.1 |
| 4,442,338 | 4/1984 | Yamazaki | 156/646 |

FOREIGN PATENT DOCUMENTS 0112031 7/1982 Japan .................. 29/576 T

OTHER PUBLICATIONS

Boyd, I. W., Jour. Appl. Phys., 54, (1983), 3561.
Boyd et al., Appl. Phys. Letts., 41, (Jul. 1982), 162.
Hanabusa et al., Appl. Phys. Letts., 35 (1979), 626.
Yaron in Electron Device Meeting, Tech. Digest, Washington, 1979, p. 220.
Nishiyama et al., Jap. Jour. Appl. Phys., 19, (1980), L-563.
Boyer et al., Appl. Phys. Letts., 40, (1982), 716.
"Short Time Annealing of As and B Ion Implanted Si Using Tungsten-Halogen Lamps", T. O. Sedgwick, R. Kalish, S. R. Mader and S. C. Shatas; IBM T. J. Watson Research Center, Yorktown Heights, N.Y. 10598; A. G. Associates, Palo Alto, CA 94303.

Primary Examiner—Upendra Roy
Attorney, Agent, or Firm—Flehr, Hohbach, Test, Albritton & Herbert

[57] ABSTRACT

A process for controlled surface reactions in semiconductor material which includes rapidly heating the material to a high temperature, maintaining the temperature for a short time and cooling the material all while the surface is exposed to a substance which reacts at the surface.

16 Claims, 3 Drawing Figures

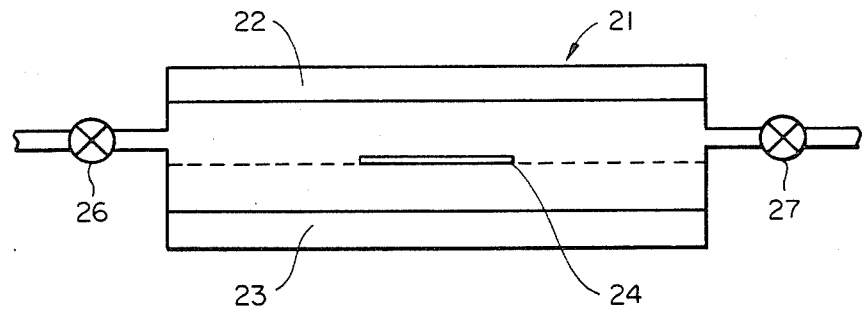
FIG_1
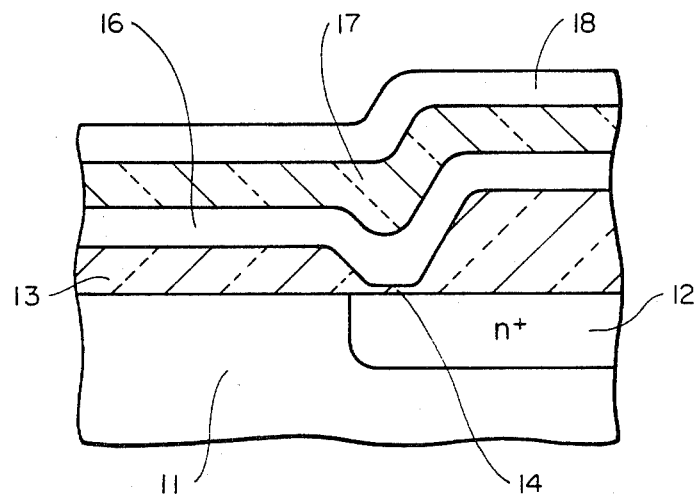
FIG_2
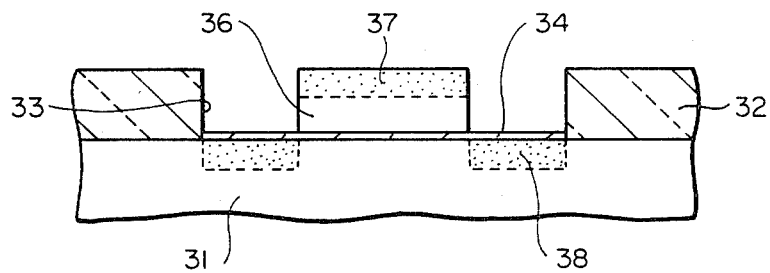
FIG_3

PROCESS FOR HIGH TEMPERATURE SURFACE REACTIONS IN SEMICONDUCTOR MATERIAL

DESCRIPTION

Technical Field

This invention relates generally to a process for controlled high temperature short time surface reactions in semiconductor materials and more particularly to a process for thin dense oxide layers, thin epitaxial layers and shallow diffusions.

BACKGROUND OF THE INVENTION

Recent publications have described the use of short time high temperature annealing to minimize dopant diffusion during post implantation annealing. The silicon is heated by radiation from light sources including tungsten-halogen lamp arrays, argon discharge lamps, xenon flash lamps and resistance heated black bodies. These high temperature radiation sources have the capability of rapidly heating silicon to a temperature of 1000°–1200° C. for controlled short periods of time.

In the E²PROM's a thin oxide is grown over a portion of the drain, after which a heavily doped polysilicon floating gate is fabricated. FIG. 2 shows a portion of a typical device including the body 11 with drain 12. An oxide layer 13 including a thin region 14 at the drain is formed on the surface of the device. A floating gate 16 is formed on the oxide layer 13. The device then includes another oxide layer 17 and an external gate 18. In operation, a high electric field is established between the floating gate and the drain, permitting electrons to tunnel from the drain to the floating gate, or vice versa. The charge supplied to the floating gate modifies the threshold voltage of the device in normal operation, thus permitting its use as a memory element.

The thin oxide is presently fabricated by conventional oxide grown at relatively low temperatures (800° C.) in order to limit the growth to approximately 100 Å. However, the "pin hole" density in the oxide, electric field at breakdown and charge trapping density characteristics of the oxide grown at this low temperature are not optimal for the device. Dense oxide layers are also important in VLSI devices. The characteristics of oxide layers are improved by increasing the oxidation temperature to 1100° C.; however, the oxide growth rate at 1100° C. is so large that conventional oxidation techniques cannot produce oxides with a well controlled thickness in the 100 Å range needed for E²PROM's, VLSI devices, MOSFETS and other semiconductor devices.

SUMMARY OF THE INVENTION

It is an object of the present invention to provide a process for forming high temperature oxides of controlled thickness.

It is known that impurity redistribution during annealing can be controlled by introducing interstitial atoms. Silicon interstitial atoms are produced by oxidation. Thus, by accurately controlling the thickness of the oxide layer, the redistribution of impurities during annealing and the depth of diffusion is controlled.

It is therefore another object of the present invention to form oxides at high temperatures and of controlled thickness to control the number of interstitial atoms and therefore control diffusion during annealing.

In accordance with another feature of the invention, the controlled thickness oxide is doped with impurities as it is grown. Thereafter the silicon wafer is rapidly heated to diffuse impurities from the oxide into the wafer in the interstitials formed during the oxidizing step.

A rapid thermal cycle is used to provice controlled etching and controlled epitaxial growth by providing an appropriate atmosphere in the furnace.

It is still another object of the invention to provide an improved high temperature process for forming controlled oxides, diffusion, etching or epitaxial growth.

The foregoing and other objects are achieved by a process which includes the step of rapidly heating a silicon wafer to a high temperature, maintaining the temperature for a predetermined short time, and cooling the wafer while the wafer is in an atmosphere containing chemical compositions which react at the surface of the wafer.

The foregoing and other objects of the invention will be clearly understood from the following description taken in conjunction with the drawings in which:

FIG. 1 schematically shows a radiative heater with gas inlet and outlet and wafer placed in the heater;

FIG. 2 is a partial view of an E²PROM; and

FIG. 3 is a partial view of an FET in a VLSI MOSFET circuit.

It is known that the oxidation of silicon is described mathematically by the relation $$x_o^2/B + x_o B/A = t \qquad (1)$$

Where t is the oxidation time, $x_o$ is the oxide thickness and (B/A) is a function of the oxidation temperature T and the crystalline orientation of the silicon, having the value $$(B/A) = 2.7 \times 10^4 \exp(-2.0/kT) \; \mu m/sec \qquad (2)$$

when oxidation is carried out in steam on (100)-oriented silicon.

For thin oxides the dominant term in Equation (1) is $$x_o/(B/A) = t \qquad (3)$$

Equation 3 can also be written $$(dx_o/dt) = (B/A). \qquad (4)$$

If the temperature T changes during oxidation, the thickness of the oxide that grows is calculated by observing that $$dx_o/dt = B(T)/A(T) = f_1(T) \qquad (5)$$

and recognizing explicitly the dependence of T on t by $$T = f_2(t) \qquad (6)$$

Inverting Equation 6 to express t as a function of T $$t = q(T) \qquad (7)$$

we can obtain $$dt = q'(T)dT \qquad (8)$$

Using Equations 4, 5 and 8, $x_o$ is expressed as:

$$x_o = \int_{T_1}^{T_2} f_1(T) q'(T) \, dT \qquad (9)$$

Equation (9) permits the calculation of thin oxide growth when the temperature T varies during the oxidation cycle.

Interest in such conditions arises because of the precise control which is achieved by using them for precise oxide growth and doping of semiconductors.

FIG. 1 schematically shows a radiation furnace 21 having radiation sources 22 and 23 for irradiating wafer 24. The furnace includes inlets 26 and 27.

DESCRIPTION OF THE PREFERRED EMBODIMENT

A precisely controlled growth of a thin oxide is achieved by a rapid thermal cycle such as produced by irradiating a silicon wafer with a bank of quartz halogen lamps or a very high intensity arc lamp. The temperature profile for such a system is approximated as follows: T rises linearly from the ambient temperature $T_a$ according to $$T - T_a = r_1 t \quad 0 < t < t_1 \qquad (10)$$

T is then held constant at the value $T_p$ it achieved at $t = t_1$ until $t = t_2$.

$$T_p = T_a + r_1 t_1 \quad t_1 < t < t_2 \qquad (11)$$

Then from $t_2$ onward, T falls approximately linearly at the rate $r_2$ $$T = T_p - r_2 t \quad t_2 < t < t_3 \qquad (12)$$

to a second temperature $T_b$. For $t > t_2$, T is expressed somewhat more accurately as an exponential function of the time $(t - t_2)$, but for exploratory purposes this level of sophistication is not essential.

In operation a temperature profile is used in which T rises from 0° C. to 1100° C. in 10 seconds, stays approximately constant at 1100° C. for 5 seconds, and then falls from 1100° C. to 400° C. in 25 seconds. For these values $T_a = 0°$ C., $r_1 = 110°$ C./sec, $T_p = 1100°$ C., $r_2 = 35°$ C./sec and $T_b = 400°$ C.

The corresponding oxide growth under steam oxidation conditions is calculated from $$x_o = x_{o1} + x_{o2} + x_{o3} \qquad (13)$$

where $$x_{o1} = \int_{273}^{1373} \frac{2.7 \times 10^4}{110} \exp(-2/kT) \, dT \qquad (14)$$
$$= 8.44 \text{ Å}$$

$$x_{o2} = [2.7 \times 10^4 \exp(-2/k * 1373)] * 5 \qquad (15)$$
$$= 63.5 \text{ Å}$$

$$x_{o3} = \int_{673}^{1373} \frac{2.7 \times 10^4}{35} \exp(-2/kT) \, dT \qquad (16)$$
$$= 26.5 \text{ Å}$$

Thus a total oxide thickness of 98.4 Å will grow. It is possible to grow thin oxides of other controlled thicknesses at will by varying both the peak temperature in the rapid thermal annealer and the time duration $(t_2 - t_1)$ at the peak. It is also possible to substitute dry oxygen for steam, which reduces the pre-exponential factor in (B/A) from $2.7 \times 10^4$ μm/sec to $1.03 \times 10^3$ μm/sec, giving a factor of 26 less oxide thickness under identical temperature conditions. The rapid thermal cycle thus provides a technique for growing thin, controllable layers of oxide on a silicon substrate.

As an example of how this process is applied in a VLSI device, where we want gate oxide thickness of approximately 100 Å, FIG. 3 shows a silicon substrate 31 with a thick (field) oxide 32 grown by conventional processing and removed by conventional photolithography in the area 33 where the FET is to be fabricated. The structure is then subjected to the oxidation cycle just described, allowing the growth of 98.4 Å of gate oxide 34. A polysilicon layer 36 is then deposited over the entire structure and defined to provide a gate layer 37 for the MOSFET. The gate oxide is then removed in the exposed areas and As implantation 38 and annealing are employed to dope the gate and simultaneously provide source and drain and gate doping. The previously defined gate layer 37 provides for self alignment of the source and drain regions, which is important for VLSI applications.

A controlled oxidation cycle such as that described above is used to provide precise control of impurity redistribution during annealing. This arises because the silicon interstitial atoms is produced by the oxidation, for example, to an enhancement of the diffusion coefficient of As at a concentration level of $10^{19}/cm^3$ of approximately 50%. Thus, if the As-implanted structure shown in FIG. 3 is annealed in vacuum at a low temperature (such as 700° C.) to repair the major crystal damage, a rapid oxidation cycle such as that described above, that will grow 100 Å of oxide over the implanted crystalline areas, will produce a redistribution of As that can be precisely controlled. Here the precise control over oxide thickness implies a small, precisely controlled number of silicon interstitials released during the oxidation and leads to a precisely limited diffusion of the arsenic during electrical activation at 1100° C. This is important since it is desired to diffuse the arsenic just past the region on the trailing edge of the As-implanted profile where dislocation loops and other defects develop during annealing.

It is also possible to grow a doped oxide by simply incorporating a doping gas in the oxidizing ambient during the controlled thickness oxidation cycle. Thus, for example, if phosphine ($PH_3$) is permitted to flow in the reaction tube, the chemical reaction

$$2PH_3 + 4O_2 \rightarrow P_2O_5 + 3H_2O \qquad (17)$$

occurs first, after which the reaction

$$2P_2O_5 + 5Si_{solid} \rightarrow 4P + 5SiO_2 \qquad (18)$$

occurs at the silicon surface, in which $SiO_2$ is formed and phosphorus is liberated, where it may dope the 100 Å thick oxide and diffuse into the silicon surface slightly.

After this reaction is completed, the oxidizing ambient is removed and replaced with, for example, dry flowing nitrogen $N_2$, after which a second rapid thermal cycle is used to diffuse phosphorus from the doped glass into the silicon to a precisely controlled depth. For example, a thermal cycle precisely equal to the one used for oxidation will diffuse phosphorus to a depth of approximately 500 Å in the underlying silicon substrate.

As another example of the general process, one begins with a silicon wafer and a gas stream composed of $N_2$ and HCl. A rapid thermal cycle with a peak temperature of 800° C. will then succeed in controlled etching of the silicon surface, thus removing residual surface oxides and contaminants and preparing the surface for epitaxy. Next, the HCl is purged from the system at low temperature and the gas stream is changed to either $SiCl_4$ plus hydrogen or pure $SiH_4$. A rapid thermal cycle reaching a peak temperature of 1200° C. will grow silicon epitaxially on the underlying substrate at a rate of approximately 1 $\mu$m/minute. Hence if the reaction proceeds for 6 seconds, a silicon epitaxial layer of thickness 100 Å is grown. This layer is doped by incorporating dopants in the gas stream as is common in conventional epitaxial reactors.

The rapid thermal process thus provides a technique for controlled layer growth, with the control being extended to layer thickness in the range of 100 Å. Multiple npnp layers are grown in this way to produce structures that can otherwise be constructed only by molecular beam epitaxial techniques, which are far more expensive.

It is also possible to deposit GaAs using $GaCl_3$ and arsine, $A_3H_4$, with the rapid thermal cycle process being used to provide controlled growth in the 50 Å thickness range. Epitaxial growth on a GaAs substrate or polycrystalline growth on a substrate of improper lattice constant (including growth of a fine grain polycrystalline layer on an amorphous substrate such as quartz) is also achieved. As with silicon these layers are doped by incorporation of appropriate gases in the growing stream.

Thus there has been provided an improved process for controlled surface reactions such as oxide growth, impurity diffusion, etching and crystal growth.

I claim:

1. A process for forming on a substrate one or more very thin films, and for controlling the uniformity of the thickness of said very thin films in a predetermined atmosphere having selected reactants comprising the steps of:

rapidly heating a substrate and linearly raising the temperature of said atmosphere at a first rate to a predetermined temperature;

maintaining said atmosphere at said elevated temperature for a selected time measured in seconds; and cooling said substrate in the presence of selected reactants to provide a linear decrease of temperature at a second rate to a relatively low temperature.

2. The process of claim 1 in which the atmosphere is an oxidizing atmosphere whereby to form an oxide at the surface of the semiconductor material.

3. A process as in claim 1 wherein said substrate is heated by pulsed radiation.

4. A process as in claim 1 wherein said predetermined temperature is in the range of about 1,000° C. to 1,200° C. and said relatively low temperature is about 400° C.

5. A process as in claim 1 wherein said predetermined temperature is maintained for about five seconds.

6. A process as in claim 1 wherein said selected reactants are introduced into the same atmosphere or environment as that used for raising and lowering the temperature of said wafer.

7. A process as in claim 1 wherein said very thin films each have a thickness less than about 500 Å.

8. A process as in claim 1 wherein said selected reactants are phosphine and nitrogen.

9. A process as in claim 1 wherein an epitaxial layer of silicon is grown to form a very thin film.

10. The process of claim 9 where the selected reactants are $N_2$ and HCl.

11. The process of claim 1 in which the atmosphere contains atoms of the semiconductor material whereby there is epitaxial growth.

12. The process of claim 2 in which the oxidizing atmosphere includes impurities whereby there is simultaneous diffusion of the impurities and formation of oxide.

13. The process of claim 11 wherein the semiconductor material is silicon and the atoms are silicon atoms.

14. The process of claim 13 in which the silicon atoms are in $SiCl_4$.

15. The process of claim 13 in which the silicon atoms are in $SiH_4$.

16. A process as in claim 9 wherein said selected reactants are nitrogen and HCl, and SiCl4 and hydrogen, or pure SiH4.

* * * * *